United States Patent
Morse et al.

(10) Patent No.: US 6,193,870 B1
(45) Date of Patent: *Feb. 27, 2001

(54) USE OF A HARD MASK FOR FORMATION OF GATE AND DIELECTRIC VIA NANOFILAMENT FIELD EMISSION DEVICES

(75) Inventors: Jeffrey D. Morse, Martinez, CA (US); Robert J. Contolini, Lake Oswego, OR (US)

(73) Assignee: The Regents of the University of California, Oakland, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/847,085

(22) Filed: May 1, 1997

(51) Int. Cl.$^7$ ................................................ C25D 5/02
(52) U.S. Cl. ................... 205/123; 205/664; 445/50
(58) Field of Search ......................... 205/122, 123; 204/10, 4; 313/109; 445/24, 27, 50

(56) References Cited

U.S. PATENT DOCUMENTS

| | | | | |
|---|---|---|---|---|
| 3,665,241 | * | 5/1972 | Spindt et al. | 313/351 |
| 5,150,192 | * | 9/1992 | Greene et al. | 357/68 |
| 5,188,977 | * | 2/1993 | Stengl et al. | 437/89 |
| 5,219,310 | * | 6/1993 | Tomo et al. | 445/24 |
| 5,382,185 | * | 1/1995 | Gray et al. | 445/49 |
| 5,462,467 | * | 10/1995 | Macaulay et al. | 445/50 |
| 5,559,389 | * | 9/1996 | Spindt et al. | 313/310 |
| 5,562,516 | * | 10/1996 | Spindt et al. | 445/24 |
| 5,578,185 | * | 11/1996 | Bergeron et al. | 205/123 |
| 5,665,421 | * | 9/1997 | Bergeron et al. | 427/64 |

FOREIGN PATENT DOCUMENTS

WO 93/18536  *  9/1993  (EP) .

OTHER PUBLICATIONS

Busta, Heinz H. "Review—Vacuum Microelectronics—1992"; Journal of Micromechanical/Microeng. vol. 2, pp 43–74, Jun. 1992.*
Cochran et al. "Low–voltage field emission from tungsten fiber arrays in a stabilized zirconia matrix"; Journal of Material Research Society; vol. 2 No. 3; pp 322–328, Jun. 1987.*
Melmed, A.J. "The art and science and other aspects of making sharp tips"; Journal of Vacuum Science Technology; B vol. 9 No. 2; pp 601–608, Apr. 1991.*

* cited by examiner

Primary Examiner—Kathryn Gorgos
Assistant Examiner—Erica Smith-Hicks
(74) Attorney, Agent, or Firm—L. E. Carnahan

(57) ABSTRACT

A process for fabricating a nanofilament field emission device in which a via in a dielectric layer is self-aligned to gate metal via structure located on top of the dielectric layer. By the use of a hard mask layer located on top of the gate metal layer, inert to the etch chemistry for the gate metal layer, and in which a via is formed by the pattern from etched nuclear tracks in a trackable material, a via is formed by the hard mask will eliminate any erosion of the gate metal layer during the dielectric via etch. Also, the hard mask layer will protect the gate metal layer while the gate structure is etched back from the edge of the dielectric via, if such is desired. This method provides more tolerance for the electroplating of a nanofilament in the dielectric via and sharpening of the nanofilament.

20 Claims, 2 Drawing Sheets

USE OF A HARD MASK FOR FORMATION OF GATE AND DIELECTRIC VIA NANOFILAMENT FIELD EMISSION DEVICES

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is related to field emission devices, particularly to gated field emitters, and more particularly to the use of a hard mask in the formation of small diameter via in a gate material layer and a high aspect ratio via in the dielectric layer to enable the formation of a nanofilament or nanocone field emitter self-aligned to the gate.

In recent years substantial effort has been directed to the use of gated field emission devices in flat panel displays and in vacuum microelectronics for radiation hard performance, lower power electron sources for ion cells, and in ultrasensitive chemical sensors. For example, it is forecast that flat panel displays will be a 10–20 billion dollar per year market by the turn of the century. Currently, the flat panel displays primarily involve active matrix liquid crystals, and field emission displays are one of the leading contenders. In field emission cathodes, both the materials of the emitter and the gate, and the geometry of emitter-gate structure are very important. By forming an extremely sharp (needle-like) emitter tip centered in a small grid (gate) hole or via, emission is more uniform among the emitters and the turn-on voltage, at which electron emission is initiated, is lowered.

Recent efforts in the development of gated field emitters having sharp tips have been directed to forming the emitter by electroplating using the grid or gate metal as a counter electrode. Such recent efforts which involved the formation of "nanocones" and "nanofilament" type emitters are exemplified by copending U.S. application Ser. No. 08/847,086, filed May 1, 1997, now U.S. Pat. No. 5,882,503 entitled "Electrochemical Formation of Field Emitters"; copending U.S. application Ser. No. 08/847,087, filed May 1, 1997, now U.S. Pat. No. 5,891,321 entitled "Electrochemical Sharpening of Field Emission Tips"; and copending U.S. application Ser. No. 08/847,088, filed May 1, 1997, pending, entitled "Formation of Nanofilament Field Emission Device With Gate Passivation, each assigned to the same assignee.

These recent efforts have established that electrochemical deposition can be utilized to form nanofilament structures in oxide vias having diameters of 50–200 nm, and aspect ratios (the ratio of the height of the filament to its diamenter) of 5–10 results in a cylindrical shaped nanofilament which is self-aligned to a gate electrode on top of the dielectric. However, in order to make these prior processes more manufacturable, it has been found that it is necessary to passivate the gate structure, see above-referenced application Ser. No. 08/847,088, thereby allowing overplating to occur, thus compensating for nonuniformity in deposition rate. Furthermore, since the electroplating of the emitter may be done on a high resistivity film or resistor layer, adhesion and initiation of the electroplated material is an issue, depending on the composition of the layer on which the emitter is to be deposited. Also, the tip of the electroplated structure must form a sharp point, centered in the gate metal via, substantially in the plane of the gate metal layer.

The formation of gate structures having 100–200 nm diameter using etched nuclear tracks in LEXAN (or other trackable materials) as the mask etched nuclear tracks in ion trackable materials, such as LEXAN, as the mask which generally results in non-uniform and irreproducible gate structures. Furthermore, the gate metal will also be eroded somewhat during the dielectric via etch as a result of sputter yield. This can result in a dielectric via with a sloped sidewall at the top. Finally, if the gate is electropolished back from the edge of the dielectric via, the gate layer suffers a general attack from the electropolish. This would be problemmatic for both electroplated nanofilaments as well as nanocones which are formed by directional deposition through the via.

The present invention enables manufacturing of gated emitters by a process for creating a nanofilament or nanocone field emission device which involves the use of a hard mask layer. The formation of high aspect ratio, electroplated nanofilament structure devices for field emission flat panel displays, for example, requires the formation of a via in a dielectric layer which is self-aligned to a gate metal via structure on top of the dielectric layer. The desired diameter of the via in the dielectric is on the order of 50–200 nm, with an aspect ratio defined by depth divided by via diameter of 5–10. By the use of a hard mask layer on top of the gate metal layer in which the pattern from etched nuclear tracks in trackable material are transferred, the gate structure and the dielectric via may be selectively etched without erosion of the gate layer while either etching the dielectric via or etching back the gate structure or the dielectric. The nanofilament is then electroplated in the via, after which the dielectric is etched back, and the nanofilament sharpened. The process of this invention provides more tolerance in the etching of the gate and dielectric vias, as well as in the electroplating of the nanofilament, dielectric etch back, and nanofilament sharpening. Also, the invention can be effectively utilized in the formation of nanocones.

SUMMARY OF THE INVENTION

It is an object of the invention to form high aspect ratio, electroplated nanofilament structures for field emission displays.

A further object of the invention is to provide for the formation of nanofilament or nanocone field emission devices using a hard mask layer.

Another object of the invention is to provide a process for fabricating sharpened high aspect ratio electroplated emitters which enables more tolerance in the gate via etch, dielectric cavity etch, electroplating and sharpening of the emitters than prior processes.

Another object of the invention is to provide a process for fabricating nanocone emitters which enables more tolerance in the gate via etch and dielectric cavity etch than prior processes.

Other objects and advantages of the present invention will become apparent from the following description and accompanying drawings. Basically, the invention involves a process for the formation of nanofilament field emission devices utilizing a hard mask layer to provide protection of the gate metal layer and greater tolerance in etching the gate via and dielectric via structures, and in electroplating the nanofilament. Also, the invention may enable the sharpening of the tip of the thus formed nanofilament by electrochemically etching using the gate metal as a counter electrode. Further, the invention involves a process for the formation of nanocone field emission devices utilizing a hard mask layer for protecting the gate metal layer and greater tolerance in etching the gate metal via and dielectric via. The process of this invention produces high efficiency field emitters, which are uniform in height and sharpness, and which are particularly applicable for use in flat panel displays and vacuum microelectronics.

BRIEF DESCRIPTION OF THE DRAWINGS

The accompanying drawings, which are incorporated into and form a part of the disclosure, illustrate operational steps for fabricating embodiments of the invention and, together with the description, serve to explain the principles of the invention.

DETAILED DESCRIPTION OF THE INVENTION

The present invention is directed to a process for creating electroplated high aspect ratio nanofilament or nanocone field emission devices. The process of this invention forms nanofilament field emission devices using a hard mask for formation of gate and dielectric via to provide more tolerance in the electroplating of the emitter. The hard mask layer will also eliminate any erosion of the gate layer during the dielectric via etch. Another application of the hard mask layer is to protect the gate layer while the gate structure is etched back from the edge of the dielectric via using either electropolishing or isotropic plasma etching. In addition, use of the hard mask layer will improve the process tolerance for forming both the gate and dielectric via, which applies to formation of both nanofilament or nanocone field emitters.

The formation of high aspect ratio, electroplated nanofilament or nanocone structure devices for field emission flat panel displays or vacuum microelectronics requires first the formation of a via or opening in a dielectric layer which is self-aligned to a via in a gate metal or material structure on top of the dielectric. The desired diameter of the via in the dielectric is on the order of 50–200 nm, with an aspect ratio of 5–10. Once the via in the dielectric is created, a nanofilament is electroplated in the via, the dielectric is then etched back away from the nanofilament, and the nanofilament is sharpened. In the case of nanocone fabrication, once the via is etched in the gate and dielectric, the cavity is etched back, then the nanocone is selectively deposited in the cavity. This process provides tolerance in the etching of the gate via, etching of the dielectric via or cavity, electroplating and sharpening process. Sharpening of the electroplated nanofilament tip may be done by electrochemical etching using the gate metal as a counter electrode. The nanofilament or nanocone of the gated field emission device produced by the process of this invention has a sharp point, centered in the gate metal via, in the plane of the gate metal layer, thereby resulting in high efficiency field emitters, which are uniform in height and sharpness.

Figure 1:
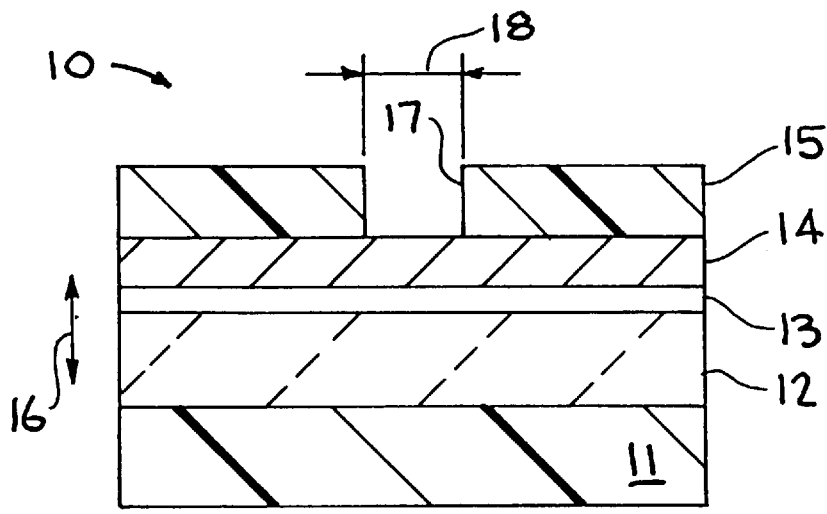
FIGS. 1–5 illustrate the formation of self-aligned vias in a first structure, in accordance with the present invention.
Figure 2:
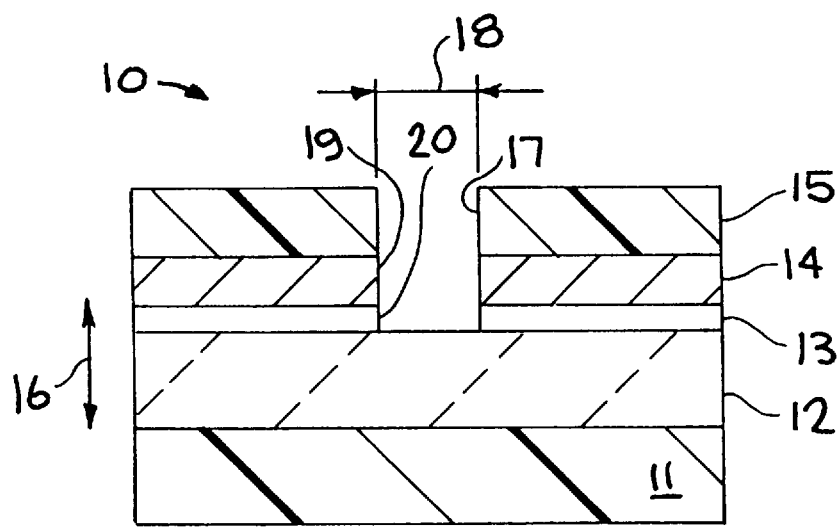
Figure 3:
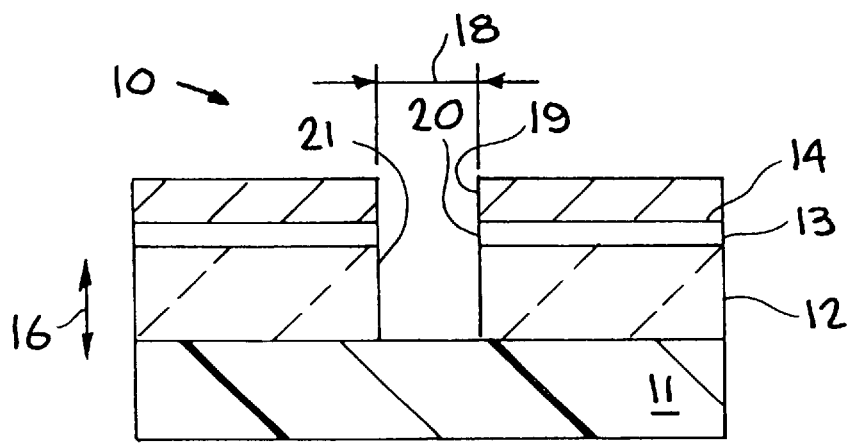

In this invention, gate structures having diameters of 50–200 nm are formed using etched nuclear tracks in LEXAN, made by General Electric Co., (or other ion trackable material) as a mask, and an intermediate hard mask layer as illustrated in FIG. 1. The thickness of the hard mask would depend on its plasma etch selectivity to the LEXAN masking layer. The hard mask must also be inert to the etch chemistry for the gate layer. For example, for Mo gates, the hard mask may be Cr or Al, while for Cr gates, the hard mask may be silicon dioxide or silicon nitride. The resulting structure after gate etch is shown in FIG. 2. The hard mask layer will also eliminate any erosion of the gate layer during the dielectric via etch. Another application of the hard mask layer is to protect the gate layer while the gate structure is etched back from edge of the dielectric via using either electropolishing or isotropic plasma etching. This is shown in FIG. 3. The use of a hard mask will improve the process tolerance for forming both the gate and dielectric via structures.

Figure 4:
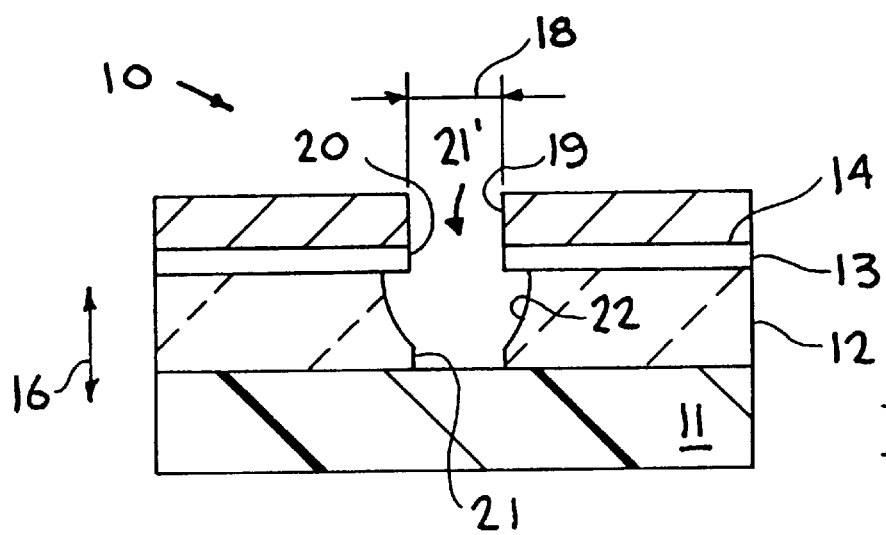
Figure 5:
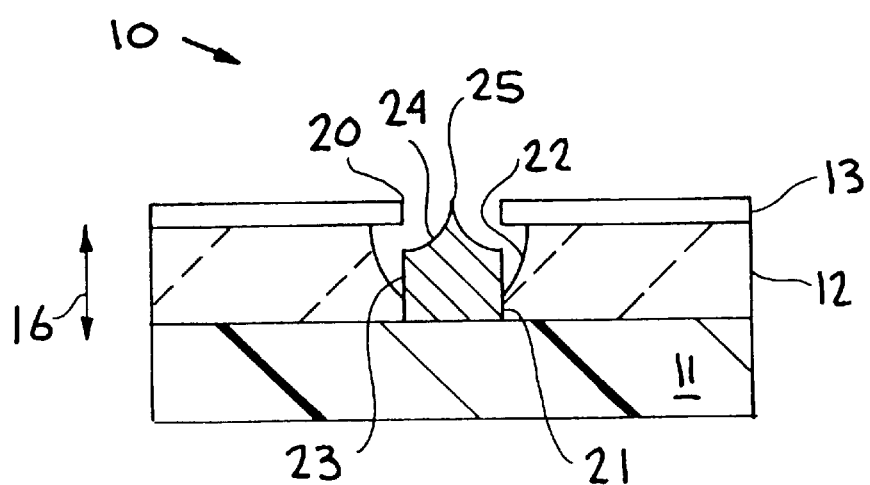

The following example, in conjunction with FIGS. 1–5 of the process of the present invention is set forth hereinafter, with FIG. 5 illustrating an embodiment of a gated field emitter with a sharpened point as produced by the process of this invention. The process comprises:

1. The formation of a stack of films or layers of materials to compose the field emitter device, with a mask layer or film on top, as shown in FIG. 1. The structure of FIG. 1, generally indicated at 10 is composed of a conductive or resistive film 11, a dielectric film or layer 12, a gate material film or layer 13, a hard mask or plating standoff layer of film 14, and a mask layer or film of ion trackable material 15. The structure 10 of FIG. 1 has a height of 350–800 nm as indicated by arrow 16. For example, the layer 11 may be composed of a conductive material such as nickel, chromium, or aluminum; or a resistive material such as cermet, silicon carbide, or amorphous silicon, the dielectric layer 12 may be composed of $SiO_2$, $Si_3N_4$, or $Al_2O_3$; the gate material layer 13 may be composed of metal or conductive material, such as chromium, aluminum, or molybdenum; the hard mask or plating standoff layer 14 may be composed of $SiO_2$, $Si_3N_4$, or $Al_2O_3$; and the mask layer 15 may be composed of an ion trackable polymer such as polycarbonate or polyimide; an ion trackable inorganic dielectric such as $SiO_2$; or an ion trackable photoresist such as AZ4110, made by Hoechst-Celanese, for high resolution lithography. The structure of FIG. 1 in the process example set forth hereinafter and illustrated in FIGS. 1–5 is composed of a resistive layer 11 of cermet having a thickness of 300 nm, a dielectric layer 12 of $SiO_2$ having a thickness of 400 nm, a gate metal layer 13 of chromium having a thickness of about 50 nm, a hard mask layer 14 of $SiO_2$ having a thickness of 40 nm, and a mask layer 15 of polycarbonate having a thickness of 600 nm.

2. A pattern is created in the mask layer 15 which includes at least one opening or via 17 having a diameter of 50–200 nm as indicated by arrow 18, by known ion tracking or other high resolution lithography.

3. The mask layer pattern is transferred into the hard mask or plating standoff layer 14 and the gate metal layer 13 by etching, either wet or plasma etch techniques to form openings or vias 19 and 20 in respective layers 14 and 13, as shown in FIG. 2. With the hard mask layer 14 composed of $Si_3N_4$, etching is carried out by standard plasma etch techniques utilizing fluorine ($F_2$) based gas chemistries ($CHF_3$, $CF_4$, $SF_6$, etc.) in parallel plate configuration in reactive ion or high density plasma etch mode. With the gate metal layer 13 composed of chromium, etching is carried out by standard plasma etch techniques using $Cl_2/O_2$ chemistry or electrochemical etching techniques. In applications where the gate metal layer 13 is composed of molybdenum, the hard mask layer 14 may be chromium or aluminum.

4. The mask layer 15 is removed, as shown in FIG. 3, by dissolution with appropriate solvent, such as acetone, or selective removal during subsequent plasma etch step ($Cl_2$, $O_2$ will remove polycarbonate film).

5. A via or cavity indicated at 21 is etched in dielectric layer 12 as shown in FIG. 3 using a high density plasma etch system which enables small feature, high aspect ratio structures to be formed therein. The advanced plasma etching is carried out by using $CHF_3/CF_4$ chemistry. Preferably, the plasma etch system allows control of plasma density with independent control of plasma ion energy, hence directionality, thereby allowing control of vertical etch rate over horizontal etch rate.

5a. If the etch selectivity of the hard mask or plating standoff layer 14 during the dielectric layer etch is not high enough such that some of the dielectric layer remains, additional layers composed of silicon or chromium, for example, can be deposited on top of the hard mask or plating standoff layer to protect it during these etch steps.

6. The dielectric sidewall material 22 of layer 12 is then etched back to form an enlarged via or cavity 21', as shown in FIG. 4. The dielectric sidewall etching may be carried out by wet etch in 6:1 buffered hydrofluoric acid. A lower portion of the via 21 may not be enlarged, as shown in FIG. 4.

7. An emitter structure 23 is formed in the vias 21, 21', 20, and 19 of layers 12, 13, and 15 by electroplating as shown in FIG. 5. The electroplating may, for example, be carried out in a nickel sultanate plating solution. For an Al/Cr cermet resistor layer 11, plating can be enhanced by initial reduction of $Cr_2O_3$ on the surface using acidic nickel sulfate solution with a pulsed voltage waveform. The electroplating of emitter structure 23 may be carried out prior to the operation 6 above to enlarge via 21 to provide forth a straight sidewall surface of the emitter structure 23. Deposition may, for example, be carried out by electron beam evaporation or sputter deposition, provided the deposition is directional so as not to deposit on the sidewall. Then material deposited on the gate or hard mask layer is selectively removed.

7a. If electroplating of the nanoemitter structure 23 cannot be easily accomplished on the resistive layer 11 or can be accomplished by a simple cleaning or etch of the resistor layer prior to plating, a plating enhancement layer may be deposited on the bottom of dielectric via or cavity 21 composed, for example, of chromium with a thickness of 1–10 nm.

7b. Additional steps can be included to improve adhesion of the electroplated nanofilament 23 to the underlying resistive film or layer 11 at the bottom of dielectric via or cavity 21. These include heating the resistive layer 11, chemical surface cleaning, sputtering, or even high energy ion irradiation to get atoms of plating material to penetrate into the surface of the resistive layer.

8. The hard mask or plating standoff layer 14 is then removed, as shown in FIG. 5 using either wet or dry etch techniques. To remove the layer 14, composed of $Si_3N_4$, the etching is carried out by set etch in hot phosphoric acid or plasma etch with standard $CF_4/O_2$ chemistry at appropriate power and pressure.

8a. Prior to removal of the hard mask layer 14, the via 20 in gate metal layer 12 can be enlarged, if desired, by electroplating or etching of the surface of the gate metal via 20.

9. The configuration of emitter structure 23 is then formed as in FIG. 5, and the tip 24 of the emitter is sharpened to produce a point 25. The configuration of the nanofilament or emitter 23 and tip 24 with sharpened point 25 may be formed by electrochemically etching using the gate metal layer 13 as a counter electrode. This etching process is described and claimed, for example, in above-referenced copending application Ser. No. 08/847,087. Briefly this etching technique is carried out by etching a nickel nanofilament using a sulfuric acid solution and a pulsed voltage applied between the cathode and gate electrode so that nickel nearest the gate is preferentially etched. Note that the point 25 of tip 24 is centered in via 20 of gate metal layer 13 and is in the plane of the gate metal layer, as seen in FIG. 5.

10. If needed, the dielectric cavity 21' can be further etched back from the nanofilament or emitter 23.

It has thus been shown that the present invention provides a process for fabricating high aspect ratio nanofilaments or emitters for field emission devices, such as flat panel displays and vacuum microelectronics. The process involves two advantageous features: 1) use of a hard mask or plating standoff layer, and 2) sharpening of the emitter tip. These features provide for gate via etching, dielectric via etching, and electroplating tolerance and uniform plating, thereby providing high efficiency field emitters, which are uniform in height and sharpness. Because of the small dimensions permitted by the process, lower electron emission initiation voltage is obtained.

While a particular embodiment and a particular sequence of process steps, along with specified materials, parameters, etc., have been set forth to exemplify and describe the principles of the invention, such are not intended to be limiting. Modifications and changes may become apparent to those skilled in the art, and it is intended that the invention be limited only by the scope of the appended claims.

The invention claimed is:

1. In a process for directly depositing a nanofilament in a gated field emission device, the improvement comprising:
    providing a layer of conductive or resistive material;
    forming a hard mask layer on at least a gate material layer;
    forming a dielectric layer intermediate the at least one gate material layer and the layer of conductive or resistive material;
    forming at least one aligned via in each of the hard mask layer, the gate material layer, and the dielectric layer by highly directional, selective plasma etching;
    forming by directional deposition an emitter structure on the layer of conductive or resistive material and in the via of the dielectric and gate material layers;
    removing the hard mask layer;
    etching back dielectric material from around the thus formed emitter structure; and
    sharpening the tip of the emitter structure.

2. The improvement of claim 1, wherein etching back the dielectric material is carried out prior to forming the emitter structure.

3. The improvement of claim 1, wherein sharpening the tip is carried out using the gate material layer as a counter electrode.

4. The improvement of claim 1, additionally including forming a layer of mask material on the layer of hard mask material, and forming at least one via in the layer of mask material.

5. The improvement of claim 4, wherein forming the layer of mask material is carried out by using material selected from the group of ion trackable and photoresist materials.

6. The improvement of claim 4, wherein the layer of mask material is selected from the group consisting of ion trackable polymers, ion trackable inorganic dielectrics, and ion trackable photoresists.

7. The improvement of claim 1, wherein the hard mask layer is formed of material selected from the group consisting of $SiO_2$, $Si_3N_4$, and $Al_2O_3$.

8. The improvement of claim 7, wherein the gate material layer is composed of metal selected from the group consisting of chromium, aluminum and molybdenum.

9. In the process of claim 1, additionally including providing a structure consisting of at least the layer of material selected from the group of conductive and resistive materials, the layer of dielectric material, the layer of gate material, the layer of hard mask material, and a layer of mask material selected from the group of ion trackable and photoresist materials, and forming at least one via in the layer of mask material.

10. The process of claim 9, additionally including removing the layer mask material prior to forming a via in the dielectric layer.

11. The improvement of claim 9, additionally including processing an area of the layer of conductive or resistive material exposed by the via in the layer of dielectric material to enhance adhesion of the electroplated emitter structure to the layer of conductive or resistive material.

12. The improvement of claim 1, wherein the emitter structure is directionally deposited to a height above the layer of dielectric material, and is carried out by a process selected from the group consisting of electroplating, electron beam evaporation, and sputter deposition.

13. The improvement of claim 1, wherein sharpening the tip of the emitter structure is carried out such that a point is formed on the tip and is located substantially centrally in a via of the gate material layer.

14. The improvement of claim 1, wherein the hard mask layer is composed of material selected from the group consisting of silicon dioxide, silicon nitride, aluminum and chromium, and the gate material layer is composed of material selected from the group consisting of molybdenum, chromium, and aluminum.

15. The improvement of claim 1, wherein the gate material layer is formed from chromium, the hard mask layer is formed from SiO$_2$, and the dielectric layer is formed from SiO$_2$, and additionally including forming a mask layer of polycarbonate on the hard mask layer.

16. A process for forming a high aspect ratio, electroplated nanofilament structure device for field emission, comprising:
   providing a structure including at least a layer of conductive or resistive material, a layer of dielectric material, a layer of gate material, a layer of hard mask material, and a layer of mask material;
   forming at least one via in the mask material layer, in the hard mask layer, and in the gate material layer by highly directional, selective plasma etching;
   removing the mask material layer;
   forming at least one via in the dielectric material layer aligned with the at least one via in the gate material layer and the hard mask layer by highly directional, selective plasma etching;
   forming an emitter structure in the via or the dielectric and gate material layers;
   removing dielectric material adjacent the emitter structure;
   removing the hard mask layer;
   configuring the emitter structure so as not to extend above the gate material layer; and
   forming a tip on the emitter structure to define a nanofilament emitter having a pointed tip located substantially in the center of the at least one via in the gate material layer.

17. The process of claim 16, wherein at least the forming of the tip of the emitter structure is carried out using the gate material layer as a counter electrode.

18. The process of claim 16, wherein the dielectric material is removed prior to forming the emitter structure.

19. In a process for directly depositing a nanocone in a gated field emission device, the improvement comprising:
   forming a hard mask layer on at least a gate material layer;
   forming a dielectric layer under the at least one gate material layer;
   forming at least one aligned via in each of the hard mask layer, the gate material layer, and the dielectric layer by highly directional, selective plasma etching;
   etching back the dielectric layer to enlarge the thus formed via to form a cavity;
   forming by directional deposition an emitter structure in the cavity of the dielectric layer and the via of the gate material layer;
   selectively removing the deposited material on the gate material and hard mask layers; and
   sharpening the tip of the emitter structure.

20. The improvement of claim 19, wherein the directional deposition of the emitter structure is carried out by a process selected from the group consisting of electroplating, electron beam evaporation, and sputter deposition.

* * * * *